(12) United States Patent
Jacobson et al.

(10) Patent No.: US 7,797,651 B1
(45) Date of Patent: Sep. 14, 2010

(54) VERIFYING DESIGN ISOLATION USING BITSTREAMS

(75) Inventors: Neil G. Jacobson, Los Altos, CA (US); John Damian Corbett, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 391 days.

(21) Appl. No.: 12/001,635

(22) Filed: Dec. 11, 2007

(51) Int. Cl.
*G06F 17/50* (2006.01)

(52) U.S. Cl. .................. 716/4; 716/1; 716/2; 716/3; 716/8; 716/9; 716/16; 716/17; 716/18; 326/37; 326/38; 326/39

(58) Field of Classification Search .................. 716/1–4, 716/8–18; 326/37–39
See application file for complete search history.

(56) References Cited

U.S. PATENT DOCUMENTS

| | | | | |
|---|---|---|---|---|
| 5,430,734 | A * | 7/1995 | Gilson | 714/725 |
| 7,143,295 | B1 * | 11/2006 | Trimberger | 713/189 |
| 7,619,438 | B1 * | 11/2009 | Trimberger | 326/10 |

\* cited by examiner

*Primary Examiner*—Nghia M Doan
(74) *Attorney, Agent, or Firm*—Kevin T. Cuenot; Lois D. Cartier

(57) ABSTRACT

A computer-implemented method of verifying electrical isolation of portions of a circuit design for a programmable integrated circuit (IC) can include translating a circuit design into a circuit design bitstream specifying a plurality of regions, wherein the regions are to be isolated from one another. Routing resources of the programmable IC that are not used by the circuit design can be identified. A fence bitstream can be generated that specifies the unused routing resources. The circuit design bitstream can be compared with the fence bitstream. An indication of whether the plurality of regions of the programmable IC are isolated can be output according to the comparison.

18 Claims, 4 Drawing Sheets

500

VERIFYING DESIGN ISOLATION USING BITSTREAMS

FIELD OF THE INVENTION

The embodiments disclosed herein relate to integrated circuit devices (ICs). More particularly, the embodiments relate to verifying electrical isolation between portions of a circuit design to be implemented within a programmable logic device type of IC.

BACKGROUND

Programmable logic devices (PLDs) are a well-known type of integrated circuit (IC) that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data (bitstream) into internal configuration memory cells that define how the programmable elements are configured. The configuration data can be read from memory (e.g., from an external PROM) or written into the FPGA by an external device. The collective states of the individual memory cells then determine the function of the FPGA.

Some applications require that system components have a degree of isolation among themselves. Within some military applications, for example, circuit designs must conform to a standard referred to as Multiple Independent Levels of Security (MILS). One aspect of MILS is the partitioning of a system so that the failure or corruption of any single partition will not corrupt any other partition of the system or cause a failure in such other partition(s). With respect to circuits, for example, MILS requires a degree of electrical isolation between different partitions of a system. Different partitions of a cryptographic application, for example, often must be isolated from one another.

SUMMARY

The embodiments disclosed herein relate to verifying electrical isolation between portions of a circuit design to be implemented within a programmable logic device (PLD) type of integrated circuit device. One embodiment of the present invention can include a computer-implemented method of verifying electrical isolation of portions of a circuit design for a PLD. The computer-implemented method can include translating a circuit design into a circuit design bitstream including a plurality of regions of the PLD, wherein the regions are to be isolated from one another, and identifying routing resources of the PLD that are unused by the circuit design. The method further can include generating a fence bitstream specifying the unused routing resources, comparing the circuit design bitstream with the fence bitstream, and outputting an indication of whether the plurality of regions of the PLD are isolated according to the comparison.

Outputting can include indicating whether at least one routing resource used by the fence bitstream is used by the circuit design bitstream.

Generating the fence bitstream can include generating a different circuit design specifying the unused routing resources and translating the different circuit design into the fence bitstream. Generating the fence bitstream also can include generating the fence bitstream to include all routing resources of the PLD that are not used by the circuit design.

Comparing can include applying the fence bitstream as a bitmask to the circuit design bitstream to determine a comparison result. For example, a logical AND operation of the fence bitstream and the bitstream can be performed. Comparing also can include indicating that each of the plurality of regions is isolated when the comparison result includes all high bits or all low bits and indicating that at least one of the plurality of regions is not isolated when the comparison result includes at least one high bit and at least one low bit.

The computer-implemented method also can include determining that an error has occurred during translation of the circuit design into the circuit design bitstream according to the comparison.

Another embodiment of the present invention can include a computer-implemented method of verifying portions of a circuit design for a PLD, including translating a first circuit design into a first bitstream including a plurality of regions, identifying routing resources of the PLD that are not used by the first circuit design, and generating a second circuit design specifying the unused routing resources. The computer-implemented method also can include translating the second circuit design into a second bitstream, comparing the first bitstream with the second bitstream, and outputting an indication of whether the plurality of regions of the first circuit design are isolated according to the comparison.

Outputting can include indicating whether at least one routing resource used by the second bitstream is used by the first bitstream. Creating a second bitstream can include creating the second circuit design to include all routing resources of the PLD that are not used by the first circuit design. Comparing can include applying the second bitstream as a bitmask to the first bitstream.

The method also can include determining that an error has occurred during translation of the first circuit design into the first bitstream according to the comparison.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to ensuring that portions of a circuit are isolated, e.g., electrically isolated, from one another when located on a same programmable logic device (PLD). In the context of cryptographic applications implemented within a field programmable gate array (FPGA), for example, one portion of the circuit that is to handle encrypted data may need to be isolated from a portion of the circuit that is to handle non-encrypted data. In another example, two portions of a circuit having different security levels may need to be isolated from one another and/or other portions of the circuit.

While a circuit design may specify one or more portions of the circuit that are to be isolated from one another when implemented within a PLD, in some cases an error may occur when the circuit design is translated into a bitstream. Accordingly, while the circuit design specifies a plurality of isolated regions, the bitstream may not. For example, a routing resource that should be unused may, as a result of a translation error, be activated or used. Such a condition can compromise isolation between the regions. The embodiments disclosed herein can detect errors introduced into a bitstream that may compromise isolation among regions of the PLD.

Figure 1:
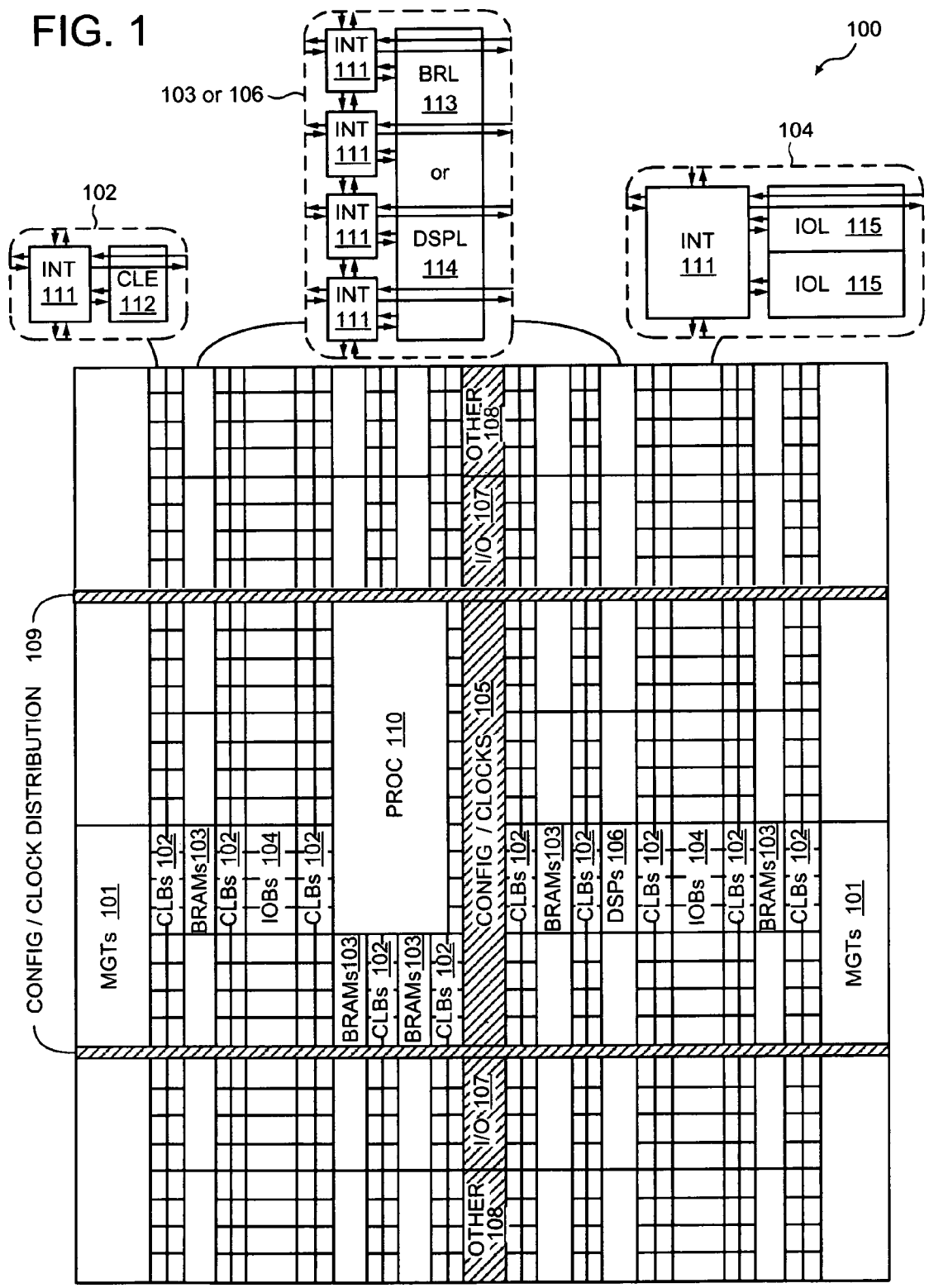
FIG. 1 is a block diagram of an exemplary field programmable gate array type of programmable logic device (PLD).

FIG. 1 is a block diagram of an exemplary FPGA type of PLD. As noted, advanced FPGAs can include several different types of programmable logic blocks in the array. For example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements. An IOB 104 can include, for example, two instances of an I/O logic element (IOL) 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die is used for configuration and/or clocks 105, and other control logic 108. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
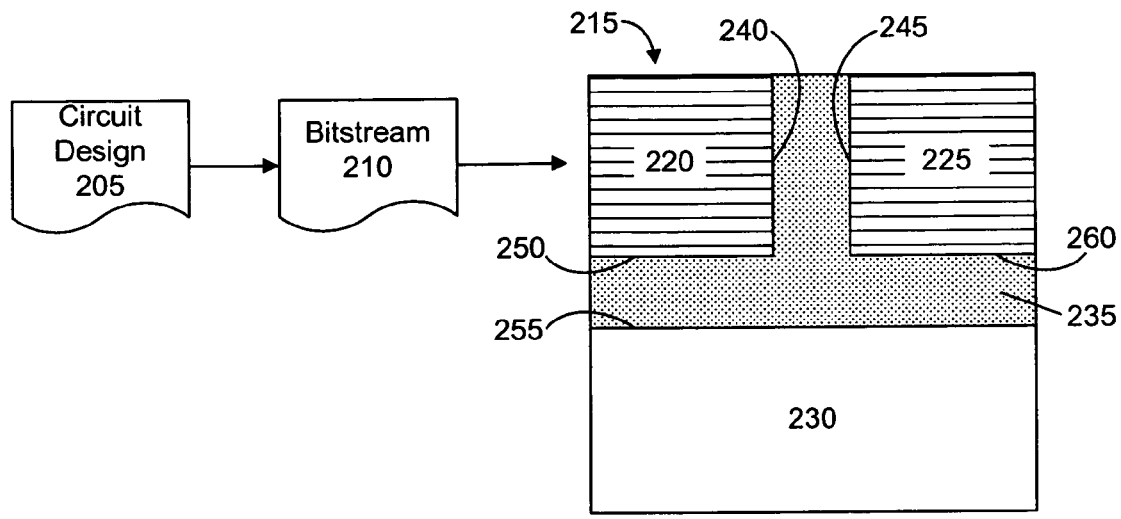
FIG. 2 is a block diagram illustrating a PLD having a plurality of isolated regions in accordance with one embodiment of the present invention.

FIG. 2 is a block diagram illustrating a PLD 215 having a plurality of isolated regions in accordance with one embodiment of the present invention. The PLD 215, for example, can be an FPGA. A circuit design 205 specifying a circuit to be implemented within the PLD 215 is shown. The circuit design 205 can be transformed into a bitstream 210. The bitstream 210, when loaded into the PLD 215, configures the PLD 215 to implement the circuit specified programmatically by the circuit design 205.

The circuit design 205, and thus the bitstream 210, can specify one or more portions of the circuit, referred to as isolation groups, to be implemented within PLD 215. Each isolation group specifies circuit elements that are to be isolated from other isolation groups. As used herein, the term "isolation group" can refer to a collection of pins and networks that may only communicate internally, e.g., with other circuit elements of the same isolation group, without restriction. Communication to other portions of the circuit external to the isolation group may only take place through explicitly defined structures, such as bus macros. It should be appreciated that isolation groups can be explicitly defined within the circuit design 205.

When accurately generated from the circuit design 205, the bitstream 210 can specify a plurality of isolated regions on the physical PLD 215. Each isolation group of the circuit design 205 can correspond with such a region. For example, one isolation group, including pins and networks, can be implemented within region 220, another isolation group can be implemented within region 225, and another isolation group can be implemented within region 230. Each of regions 220, 225, and 230 can be self-contained and isolated from one another. For example, each node of the isolation group within region 220 can be isolated from each node of the isolation group located within region 225. The nodes of each respective isolation group are not distributed throughout PLD 215, in an effort to efficiently utilize circuit resources and/or reduce their influence on circuit timing.

In FIG. 2, regions 220 and 225 are shown with horizontal lines indicating that both regions are dedicated to processing encrypted data. Each of regions 220 and 225 can be said to be a "black region" processing "black data." For example, region 225 may be a redundant copy of region 220. In another example, region 220 may be rated at one security level, while regions 225 and/or 230 may be rated at different security levels. Region 230 can be a region of the circuit that handles non-encrypted data. In that regard, region 230 can be said to be a "red region" handling "red data". In any case, each of the regions 220, 225, and 230, as well as the corresponding isolation group within each respective region, is to be isolated from each other region.

Area 235 of PLD 215 can be referred to as a "fence." The fence 235 can refer to a portion, e.g., a channel, of the PLD 215 that is unused and which separates isolation groups, and thus, separates regions 220, 225, and 230. In one embodiment, the width of the fence 235 separating the right edge of region 220, denoted as boundary 240, and the left edge of region 225, denoted as boundary 245, can be at least a minimum width of "w" to ensure electrical isolation. In another embodiment, the fence 235 between boundaries 240 and 245 can be at least one column of unused CLBs in width.

Similarly, the width of the fence 235 between the lower edge of region 220, denoted as boundary 250, and the top edge of region 230, denoted as boundary 255, can be a minimum width "w." Alternatively, boundary 250 and boundary 255 can be separated by at least one row of unused CLBs. A similar situation can be observed with respect to the distance between boundary 260, referring to the lower edge of region 225, and boundary 255.

The area represented by fence 235 represents unused, or un-programmed, circuit elements of the PLD 215. As used herein, an "unused" circuit element refers to a physical circuit element on PLD 215 that is not communicatively linked, whether electrically, optically, magnetically, etc., with the circuit implemented on PLD 215. Such circuit elements may include, for example, routing resources such as PIPs and wires. It should be appreciated that when routing resources are unused, other types of circuit elements such as CLBs also may be unused and exist within the fence 235, as such structures remain disconnected from modules 220, 225, and/or 230. With respect to a circuit design including isolation groups, a fence is not an explicitly defined group of circuit elements. Rather, the fence is formed from the absence of circuitry or programmed circuit elements that provide electrical isolation between regions 220, 225, and 230.

While the fence 235 is largely formed of unused circuit elements, the fence 235 may include certain exempt circuit structures that have been determined to carry negligible information content. Such structures can include, for example, clock networks, power lines, and ground lines. Panic alarm resets and other global system resources may be exempt as well. Other exempt structures may include shared circuit structures that are explicitly defined in the circuit design 205 to allow two isolation groups to communicate with one another. The existence of an exempt structure within the fence 235 can be ignored in terms of evaluating the electrical isolation provided by the fence 230.

Figure 3:
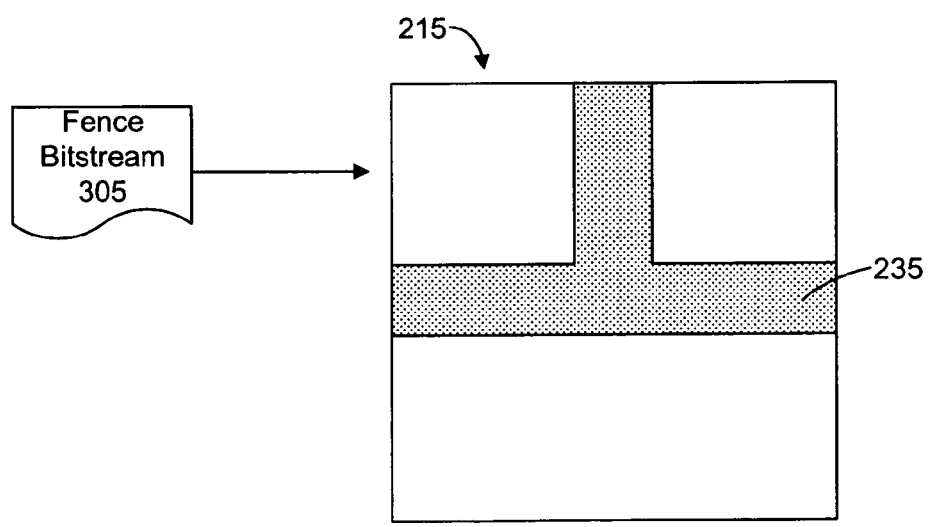
FIG. 3 is a block diagram illustrating a fence in accordance with another embodiment of the present invention.

FIG. 3 is a block diagram illustrating the fence 235 of FIG. 2 in accordance with another embodiment of the present invention. The fence 235 can be explicitly specified by a bitstream such as fence bitstream 305. In general, the circuit design 205 of FIG. 2 can be processed to identify any unused routing resources of the target PLD, e.g., PLD 215. Those routing resources, e.g., all routing resources of the PLD 215 not used by circuit design 205, can be used to generate a fence bitstream 305, which explicitly specifies the fence 235. Loading the fence bitstream 305 into the PLD 215 will result in a circuit that utilizes all unused routing resources of the circuit design 205. In general, the circuit specified by the fence bitstream 305 may be considered the negative of the circuit design 205 of FIG. 2, at least in terms of routing resources.

It should be appreciated that since the fence bitstream 305 can specify all routing resources of the PLD 215 that are not used by circuit design 205, the fence bitstream 305 will likely specify, or activate, more wires than included in the fence 235. Still, at a minimum, the fence bitstream 305 will cause those wires located in the fence 235 to be used. Further, though the description of the fence bitstream 305 has been in terms of unused routing resources, in another embodiment any circuit elements of the PLD 215 that are unused by circuit design 205 of FIG. 2, e.g., CLBs, also may be included. As such structures would be linked to isolated regions via routing resources, those skilled in the art will appreciate that specifying routing resources of the PLD 215 that are not used by the circuit design 205 indirectly indicates such circuit components.

Figure 4:
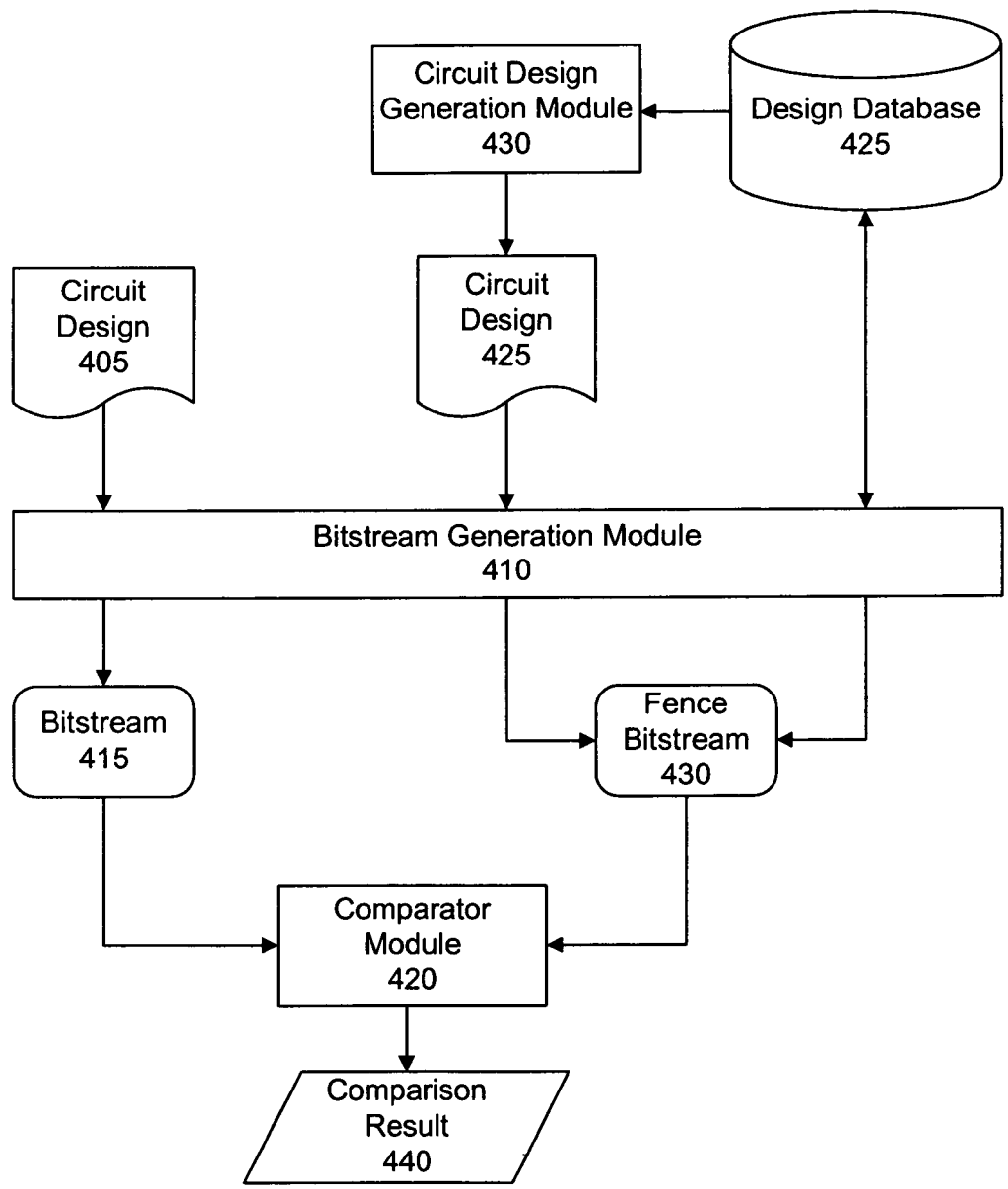
FIG. 4 is a block diagram illustrating the comparison of circuit designs at the bitstream level in accordance with another embodiment of the present invention.

FIG. 4 is a block diagram illustrating the comparison of circuit designs at the bitstream level in accordance with another embodiment of the present invention. FIG. 4 illustrates a technique for comparing bitstreams to ensure that regions of the PLD that are intended to be isolated from one another are isolated. The embodiments illustrated in FIG. 4 depict a technique for detecting errors that may occur during translation of a circuit design into the bitstream that actually programs the PLD.

A circuit design 405 can be processed by a bitstream generation module 410. The bitstream generation module 410 can translate the circuit design 405 into a bitstream 415. The circuit design 405 can specify one or more isolation groups. After translation of circuit design 405 into bitstream 415 by the bitstream generation module 410, the bitstream 415 should specify a plurality of isolated regions. Each isolated region of the PLD can correspond to an isolation group. Each isolated region of the PLD can be separated by a fence as discussed with respect to FIG. 2. Bitstream 415 can be provided to a comparator module 420.

In one embodiment, the unused routing resources, e.g., wires, of circuit design 405 can be identified from a design database 425. The design database 425 can specify a listing of available circuit elements of the physical target device, e.g., logic blocks, wires, and the like. The design database 425 can indicate which of the circuit elements are used by a given circuit design, e.g., circuit design 405, and which are not.

A circuit design generation module 430 can identify the unused circuit elements from the design database 425. In one embodiment, the circuit design generation module 430 can identify only routing resources of the PLD that are not used by the circuit design 405. In another embodiment, the circuit design generation module 430 can identify routing resources and other circuit elements of the PLD that are not used by circuit design 405.

In one embodiment, the circuit design generation module 430 can generate a circuit design 425 using the identified elements from the design database 425. The circuit design generation module 430 can provide the circuit design 425 to the bitstream generation module 410. The bitstream generation module 410 can translate the circuit design 425 into a fence bitstream 430.

In another embodiment, the bitstream generation module 410 can identify unused circuit elements from the design database 425. The bitstream generation module 410 can create the fence bitstream 430 directly from information extracted or identified from the design database 425 without the intermediate creation of circuit design 425.

In any case, the fence bitstream 430 can be provided from the bitstream generation module 410 to the comparator module 420. The comparator module 420 can compare bitstream 415 with fence bitstream 430 and output a comparison result 440. In general, the fence bitstream 430 specifies the maximally violating case, e.g., a circuit that utilizes all routes of the fence that is to include only unused routing resources. If the bitstream 415 uses any bits of the fence bitstream 430, the bitstream 415 violates the fence. This may indicate that an error has occurred when generating bitstream 415 from circuit design 405.

It should be appreciated that the different modules depicted in FIG. 4 may be implemented as standalone applications or as components that function within and/or exist as part of a larger development tool and/or platform. As such, the embodiments disclosed herein are not intended to be limited to one particular implementation or the illustrative examples provided herein.

Figure 5:
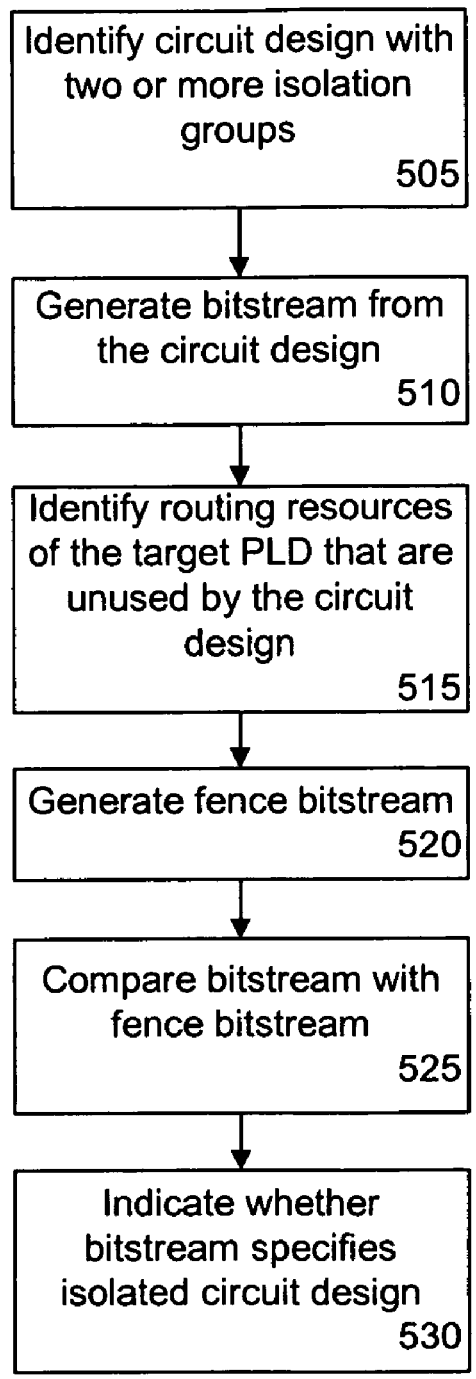
FIG. 5 is a flow chart illustrating a method of verifying isolation of portions of a circuit design at the bitstream level in accordance with another embodiment of the present invention.

FIG. 5 is a flow chart illustrating a method 500 of verifying isolation of portions of a circuit design at the bitstream level in accordance with another embodiment of the present invention. The method can be performed by one or more software-based circuit design tools as described herein. Accordingly, in step 505, a circuit design can be identified that specifies two or more isolation groups. In step 510, a bitstream can be generated from the circuit design. The bitstream can specify a plurality of regions within the target PLD that are to be isolated from one another. As noted, each isolation group can correspond to a region.

In step 515, routing resources of the target PLD that are not used by the circuit design can be identified. As noted, circuit elements such as logic blocks, CLBs, etc., may also be identified. In step 520, a fence bitstream can be generated. The fence bitstream can specify a circuit that, when implemented in the target PLD, will include, or utilize, all of the circuit elements identified in step 515. As noted, in one embodiment, the bitstream can be generated directly from the design database once the unused routing resources are identified. In another embodiment, an intermediate circuit design can be generated, e.g., a netlist or other programmatic circuit description can be generated specifying the unused routing resources from which the bitstream can be created. In that case, the fence bitstream can be generated from the intermediate circuit design.

In step 525, the bitstream can be compared with the fence bitstream. For example, the fence bitstream can be applied as a mask to the bitstream. Since the fence bitstream specifies only those circuit elements of the PLD that are not used by the circuit design, a logical AND of the two bitstreams should yield a result of zero. A zero result will indicate that the bitstream does not utilize any routing resources (or other circuit elements) of the fence. Accordingly, the bitstream does specify a circuit design in which the isolation groups are properly isolated. Further, the comparison indicates that the circuit design was translated into a bitstream accurately. If the comparison yields a result that is non-zero, for example, the bitstream does utilize circuit elements, whether routing resources, CLBs, or the like, that are used by the fence bitstream. In that case, the regions of the circuit design, as specified by the bitstream, that are to be isolated from one another are not isolated.

In step 530, an indication of whether the bitstream specifies an isolated circuit design can be output. As used herein, the terms "outputting" and/or "output" can mean, for example, writing to a file, writing to a user display or other output device, playing audible notifications, sending or transmitting to another system, exporting, or the like. It should be appreciated that when the comparison result indicates that the bitstream does not specify an isolated circuit design, such a result can be an indication that the circuit design may have been inaccurately, or erroneously, translated into the bitstream.

The flowcharts in the figure illustrate the architecture, functionality, and operation of possible implementations of systems, methods, and computer program products according to various embodiments of the present invention. In this regard, each block in the flowchart may represent a module, segment, or portion of code, which comprises one or more portions of computer-usable program code that implements the specified logical functions.

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of verifying electrical isolation of portions of a circuit design for a programmable integrated circuit (IC), the method comprising:
    translating a circuit design into a circuit design bitstream comprising a plurality of regions of the programmable IC, wherein the regions are to be isolated from one another;
    identifying routing resources of the programmable IC that are unused by the circuit design;
    generating a fence bitstream specifying the unused routing resources wherein generating the fence bitstream comprises: generating a different circuit design specifying the unused routing resources; and translating the different circuit design into the fence bitstream;
    comparing, by a computer, the circuit design bitstream with the fence bitstream to determine whether the at least one circuit element of the circuit design bitstream is used by the fence bitstream; and
    outputting an indication of whether the plurality of regions of the programmable IC are isolated according to the comparison.

2. The computer-implemented method of claim 1, wherein the outputting comprises indicating whether at least one routing resource used by the fence bitstream is used by the circuit design bitstream.

3. The computer-implemented method of claim 1, wherein generating the fence bitstream comprises generating the fence bitstream to include all routing resources of the programmable IC that are not used by the circuit design.

4. The computer-implemented method of claim 1, wherein the comparing comprises applying the fence bitstream as a bitmask to the circuit design bitstream to determine a comparison result.

5. The computer-implemented method of claim 4, wherein the comparing comprises performing a logical AND operation of the fence bitstream and the circuit design bitstream.

6. The computer-implemented method of claim 4, wherein the comparing further comprises:
    indicating that each of the plurality of regions is isolated when the comparison result comprises all high bits or all low bits; and
    indicating that at least one of the plurality of regions is not isolated when the comparison result comprises at least one high bit and at least one low bit.

7. The computer-implemented method of claim 1, further comprising determining that an error has occurred during translation of the circuit design into the circuit design bitstream according to the comparison.

8. A computer-implemented method of verifying portions of a circuit design for a programmable integrated circuit (IC), the method comprising:
    translating a first circuit design into a first bitstream comprising a plurality of regions;
    identifying routing resources of the programmable IC that are not used by the first circuit design;
    generating a second circuit design specifying the unused routing resources;
    translating the second circuit design into a second bitstream;
    comparing, by a computer, the first bitstream with the second bitstream to determine whether at least one circuit element of the first bitstream is used by the second bitstream; and
    outputting an indication of whether the plurality of regions of the first circuit design are isolated according to the comparison.

9. The computer-implemented method of claim 8, wherein the outputting comprises indicating whether at least one routing resource used by the second bitstream is used by the first bitstream.

10. The computer-implemented method of claim 8, wherein generating the second circuit design comprises creating the second circuit design to include all routing resources of the programmable IC that are not used by the first circuit design.

11. The computer-implemented method of claim 8, wherein the comparing comprises applying the second bitstream as a bitmask to the first bitstream.

12. The computer-implemented method of claim 8, further comprising determining that an error has occurred during translation of the first circuit design into the first bitstream according to the comparison.

13. A computer program product comprising:
    a non-transitory computer-usable medium having computer-usable program code that verifies electrical isolation of portions of a circuit design for a programmable integrated circuit (IC), the computer-usable medium comprising:
    computer-usable program code that translates a circuit design into a circuit design bitstream comprising a plurality of regions of the programmable IC, wherein the regions are to be isolated from one another;
    computer-usable program code that identifies routing resources of the programmable IC that are unused by the circuit design;
    computer-usable program code that generates a fence bitstream specifying the unused routing resources wherein the computer-usable program code that generates the fence bitstream comprises: computer-usable program code that generates a different circuit design specifying the unused routing resources; and computer-usable program code that translates the different circuit design into the fence bitstream;

computer-usable program code that compares the circuit design bitstream with the fence bitstream to determine whether the circuit design bitstream comprises at least one same bit as the design bitstream; and computer-usable program code that outputs an indication of whether the plurality of regions of the programmable IC are isolated according to the comparison.

14. The computer program product of claim 13, wherein the computer-usable program code that outputs comprises computer-usable program code that indicates whether at least one routing resource used by the fence bitstream is used by the circuit design bitstream.

15. The computer program product of claim 13, wherein the computer-usable program code that generates the fence bitstream comprises computer-usable program code that generates the fence bitstream to include all routing resources of the programmable IC that are not used by the circuit design.

16. The computer program product of claim 13, wherein the computer-usable program code that compares comprises computer-usable program code that applies the fence bitstream as a bitmask to the circuit design bitstream to determine a comparison result.

17. The computer program product of claim 16, wherein the computer-usable program code that compares further comprises:

computer-usable program code that indicates that each of the plurality of regions is isolated when the comparison result comprises all high bits or all low bits; and computer-usable program code that indicates that at least one of the plurality of regions is not isolated when the comparison result comprises at least one high bit and at least one low bit.

18. The computer program product of claim 13, further comprising computer-usable program code that determines that an error has occurred during translation of the circuit design into the circuit design bitstream according to the comparison.

* * * * *